(12) United States Patent
You et al.

(10) Patent No.: US 10,686,054 B2
(45) Date of Patent: Jun. 16, 2020

(54) SEMICONDUCTOR DEVICE

(71) Applicant: TAIWAN SEMICONDUCTOR MANUFACTURING CO., LTD., Hsinchu (TW)

(72) Inventors: Jheng-Sheng You, Hsinchu County (TW); Hsin-Chih Lin, Hsinchu (TW); Kun-Ming Huang, Taipei (TW); Lieh-Chuan Chen, Hsinchu (TW); Po-Tao Chu, New Taipei (TW); Shen-Ping Wang, Keelung (TW); Chien-Li Kuo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/195,683

(22) Filed: Nov. 19, 2018

(65) Prior Publication Data

US 2019/0109210 A1 Apr. 11, 2019

Related U.S. Application Data

(60) Continuation of application No. 15/947,356, filed on Apr. 6, 2018, now Pat. No. 10,134,897, which is a division of application No. 14/839,931, filed on Aug. 29, 2015, now Pat. No. 9,941,384.

(51) Int. Cl.
*H01L 29/66* (2006.01)
*H01L 29/45* (2006.01)
*H01L 29/778* (2006.01)
*H01L 29/417* (2006.01)
*H01L 29/10* (2006.01)
*H01L 29/40* (2006.01)

(52) U.S. Cl.
CPC ...... *H01L 29/66462* (2013.01); *H01L 29/452* (2013.01); *H01L 29/7786* (2013.01); *H01L 29/1066* (2013.01); *H01L 29/402* (2013.01); *H01L 29/41758* (2013.01)

(58) Field of Classification Search
USPC .. 257/429, 461, 737, 21, 82, 98, 89, 88, 76, 257/96, 100; 438/73, 586, 33, 47, 22
See application file for complete search history.

(56) References Cited

U.S. PATENT DOCUMENTS

| | | |
|---|---|---|
| 7,038,252 B2 | 5/2006 | Saito et al. |
| 8,633,094 B2 | 1/2014 | Ramdani et al. |
| 9,093,512 B2 | 7/2015 | Ohki |

(Continued)

FOREIGN PATENT DOCUMENTS

| | | |
|---|---|---|
| JP | 2012-175018 A | 9/2012 |
| KR | 10-2014-0012507 A | 2/2014 |

(Continued)

*Primary Examiner* — Moin M Rahman
(74) *Attorney, Agent, or Firm* — Maschoff Brennan

(57) ABSTRACT

A semiconductor device includes a first III-V compound layer, a second III-V compound layer over the first III-V compound layer, a source contact and a drain contact over the second III-V compound layer, a gate contact over the second III-V compound layer and between the source contact and the drain contact, a gate field plate over the second III-V compound layer, a first etch stop layer over the source contact, and a second etch stop layer over the drain contact and separated from the first etch stop layer.

20 Claims, 18 Drawing Sheets

(56) References Cited

U.S. PATENT DOCUMENTS

| | | |
|---|---|---|
| 9,231,093 B2 | 1/2016 | Jeon et al. |
| 9,245,738 B2 | 1/2016 | Jeon et al. |
| 9,685,338 B2 | 6/2017 | Minoura et al. |
| 9,837,438 B2 | 12/2017 | Cao et al. |
| 2001/0038973 A1 | 11/2001 | Sandhu et al. |
| 2006/0065912 A1 | 3/2006 | Beach |
| 2006/0211206 A1 | 9/2006 | Rao et al. |
| 2007/0018199 A1 | 1/2007 | Sheppard et al. |
| 2013/0069173 A1 | 3/2013 | Chang et al. |
| 2013/0126884 A1* | 5/2013 | Romano .......... H01L 29/66212 257/76 |
| 2013/0140605 A1 | 6/2013 | Ramdani et al. |
| 2014/0061659 A1 | 3/2014 | Teplik et al. |
| 2014/0092638 A1 | 4/2014 | Nishimori et al. |
| 2014/0252368 A1 | 9/2014 | Lee et al. |
| 2014/0327047 A1 | 11/2014 | Haider et al. |
| 2015/0028384 A1 | 1/2015 | Cao et al. |
| 2016/0086980 A1 | 3/2016 | Cao et al. |
| 2016/0359033 A1 | 12/2016 | Minoura et al. |

FOREIGN PATENT DOCUMENTS

| | | | |
|---|---|---|---|
| KR | 10-2014-0070248 A | 6/2014 | |
| KR | 10-2014-0105056 A | 9/2014 | |
| TW | 201101394 A | 1/2011 | |
| TW | 201417280 A | 5/2014 | |
| TW | 201417286 A | 5/2014 | |
| TW | 201519363 A | 5/2015 | |

* cited by examiner

SEMICONDUCTOR DEVICE

PRIORITY CLAIM AND CROSS-REFERENCE

This application is a continuation of U.S. application Ser. No. 15/947,356, filed Apr. 6, 2018, now U.S. Pat. No. 10,134,867, issued Nov. 20, 2018, which is a divisional of U.S. application Ser. No. 14/839,931, filed Aug. 29, 2015, now U.S. Pat. No. 9,941,384, issued on Apr. 10, 2018, all of which are herein incorporated by reference in their entireties.

BACKGROUND

The semiconductor integrated circuit (IC) industry has experienced exponential growth. Technological advances in IC materials and design have produced generations of ICs where each generation has smaller and more complex circuits than the previous generation. In semiconductor technology, gallium nitride (GaN) as the third generation of wide band gap semiconductor material, has characteristics of large band gap, high breakdown voltage, the two-dimensional electron gas has large electron velocity at high concentrations. Gallium nitride is used to form various integrated circuit devices, such as high power field-effect transistors, metal insulator semiconductor field effect transistors (MISFETs), high frequency transistors, and high electron mobility transistors (HEMTs).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
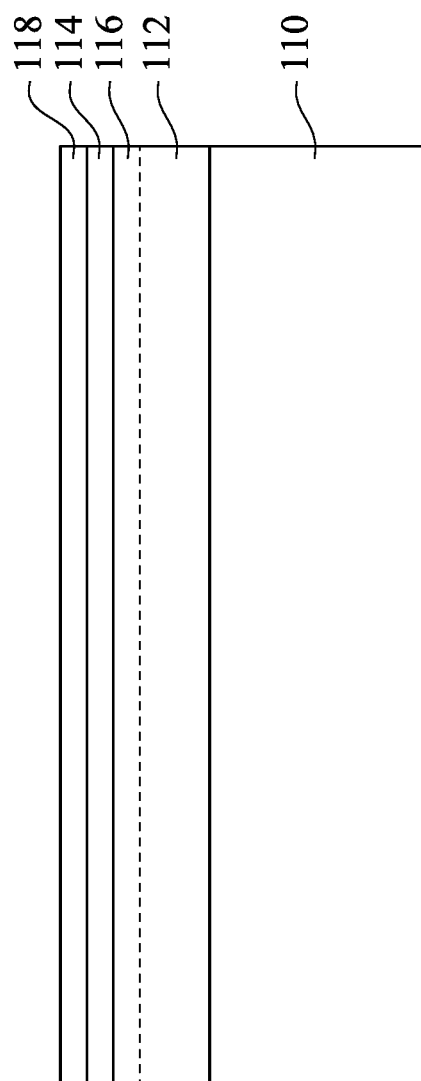
FIG. 1 to FIG. 16 are cross-sectional views of different steps of a method of fabricating a semiconductor device, in accordance of some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 16 are cross-sectional views of different steps of a method of fabricating a semiconductor device, in accordance of some embodiments of the disclosure. In FIG. 1, a semiconductor structure 100 includes a substrate 110, a first III-V compound layer 112 formed on the substrate 110 and a second III-V compound layer 114 formed on the first layer 112.

The substrate 110 is a semiconductor substrate. In some embodiments, the semiconductor substrate is made of, for example, silicon; a compound semiconductor, such as silicon carbide, indium arsenide, or indium phosphide; or an alloy semiconductor, such as silicon germanium carbide, gallium arsenic phosphide, or gallium indium phosphide. The substrate 110 may also include various doped regions, dielectric features, or multilevel interconnects in the semiconductor substrate.

The first III-V compound layer 112 and the second III-V compound layer 114 are compounds made from the III-V groups in the periodic table of elements. However, the first III-V compound layer 112 and the second III-V compound layer 114 are different from each other in composition. In some embodiments of the semiconductor structure 110, the first III-V compound layer 112 includes a gallium nitride (GaN) layer (also referred to as the GaN layer 112). The GaN layer 112 can be epitaxially grown by a number of processes including, but not limited to, metal organic chemical vapor deposition (MOCVD), also known as metal organic vapor phase epitaxy (MOVPE), using appropriate nitrogen and gallium containing precursors. For example, exemplary gallium containing precursors are trimethlgallium (TMG), triethylgallium (TEG) or other suitable chemical precursors. Exemplary nitrogen precursors include, but are not limited to, phenyl hydrazine, dimethylhydrazine, tertiarybutylamine, ammonia, or other suitable chemical precursors.

In some embodiments, the second III-V compound layer 114 includes an aluminum gallium nitride (AlGaN) layer (also referred to as the AlGaN layer 114). The AlGaN layer 114 can be epitaxially grown by MOCVD using appropriate aluminum, nitrogen and gallium precursors. The aluminum precursor includes trimethylaluminum (TMA), triethylaluminum (TEA), or suitable chemical precursors. Exemplary gallium containing precursors are trimethlgallium (TMG), triethylgallium (TEG) or other suitable chemical precursors. Exemplary nitrogen precursors include, but are not limited to, phenyl hydrazine, dimethylhydrazine, tertiarybutylamine, ammonia, or other suitable chemical precursors. The AlGaN layer 114 can also be referred to as a barrier layer. The GaN layer 112 and the AlGaN layer 114 directly contact each other. A transition layer, usually present between the substrate 110 and the GaN layer 112, is not shown.

Different materials formed on the semiconductor substrate 110 causes the layers to have different band gaps. A band gap discontinuity between the GaN layer 112 and the AlGaN layer 114, along with the piezo-electric effect, creates a very thin layer 116 of highly mobile conducting electrons in the GaN layer 112. The thin layer 116 contributes to a conductive two dimensional electron gas (2DEG) region near the junction of the two layers. The thin layer 116

(also referred to as the 2DEG region 116) allows charge to flow through the device. This barrier layer, such as the AlGaN layer 114 may be doped or undoped. Because the 2DEG region exists under the gate at zero gate bias, most nitride devices are normally on, or depletion mode devices.

The semiconductor structure further includes a third III-V compound layer 118 disposed on the AlGaN layer 114. In some embodiments, the third III-V compound layer 118 is a doped III-V compound layer, such a p-type doped GaN layer (also referred to as the doped GaN layer 118). The doped GaN layer 118 can be epitaxially grown by MOCVD using appropriate aluminum, nitrogen and gallium precursors. The aluminum precursor includes trimethylaluminum (TMA), triethylaluminum (TEA), or suitable chemical precursors. Exemplary gallium containing precursors are trimethlgallium (TMG), triethylgallium (TEG) or other suitable chemical precursors. Exemplary nitrogen precursors include, but are not limited to, phenyl hydrazine, dimethylhydrazine, tertiarybutylamine, ammonia, or other suitable chemical precursors. The AlGaN layer 114 can also be referred to as a barrier layer.

Figure 2:
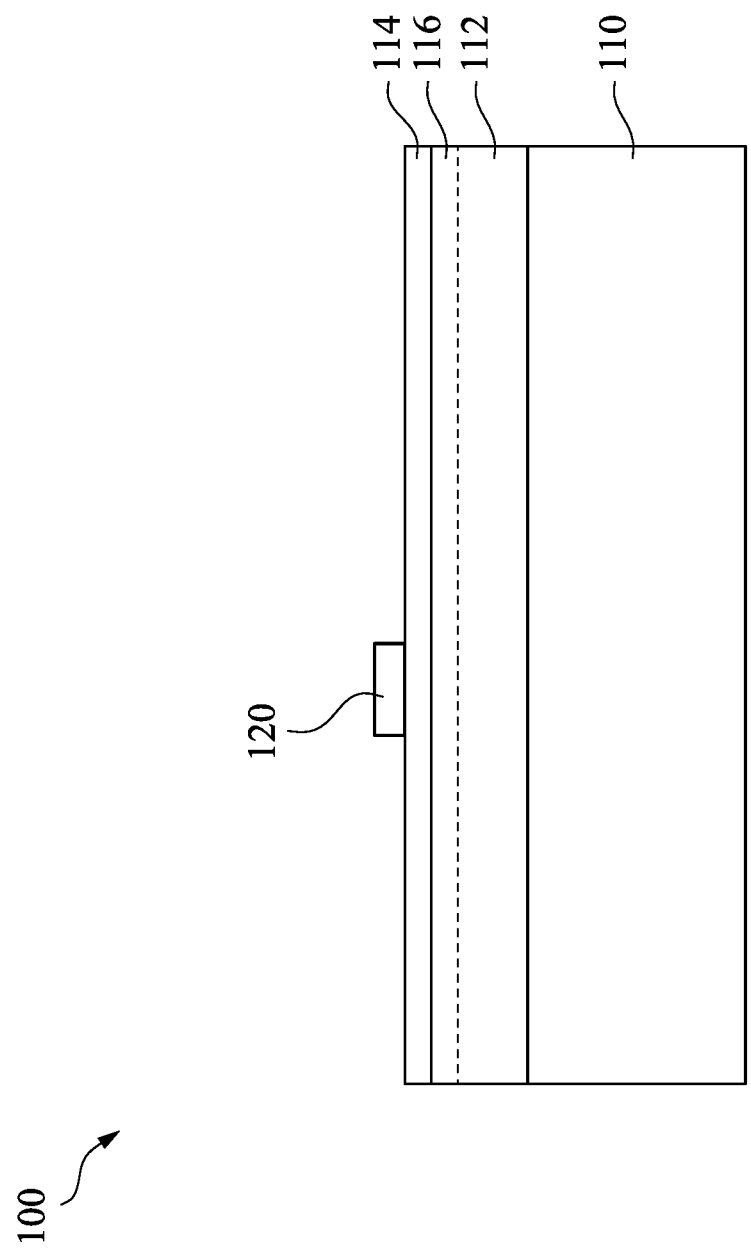

Referring to FIG. 2, the doped GaN layer is patterned for defining a doped GaN region 120 on the AlGaN layer 114. In some embodiments, a mask layer, such as a photoresist layer is formed on the doped GaN layer, and the mask layer is patterned by a lithography process to form a plurality of features and a plurality of openings defined by the features on the doped GaN layer 118. The pattern of the mask layer is formed according to a predetermined integrated circuit pattern. The lithography process may include photoresist coating, exposing, post-exposure baking, and developing. Then, an etching process is performed to define the doped GaN region 120.

Figure 3:
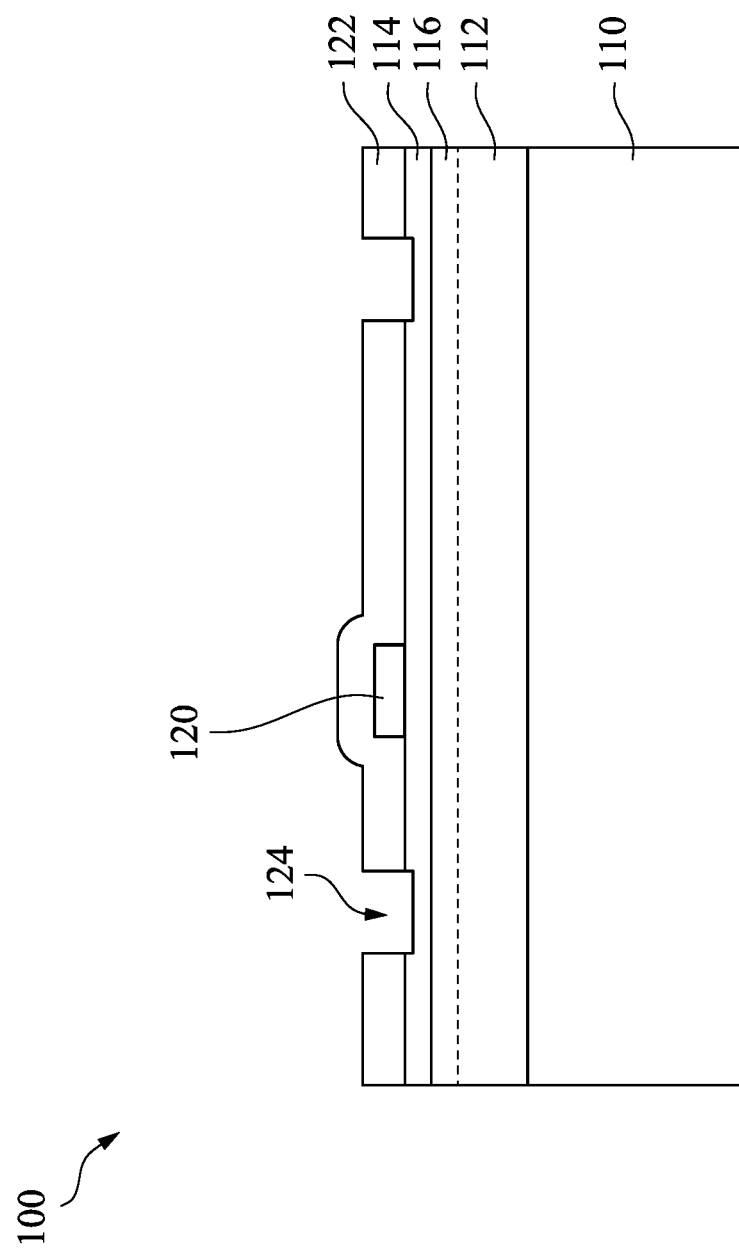

Referring to FIG. 3, a dielectric layer 122 is formed on the doped GaN region 120 and on the AlGaN layer 114. The dielectric layer 122 can be made of silicon oxide, silicon nitride, silicon oxynitride, silicon carbide, low-dielectric constant dielectric material or a combination thereof. The dielectric layer 122 can be formed by a deposition process, such as an ALD process, a CVD process, or a PVD process. The thickness of the dielectric layer 122 is in a range from about 300 angstrom to about 3000 angstrom.

The dielectric layer 122 is further patterned to define a plurality of ohmic contact regions 124 in the dielectric layer 122. In some embodiments, the dielectric layer 122 is selectively etched and cleaned to define the ohmic contact regions 124. Exemplary etching processes include sputter etching, reactive gas etching, chemical etching and ion milling.

Figure 4:
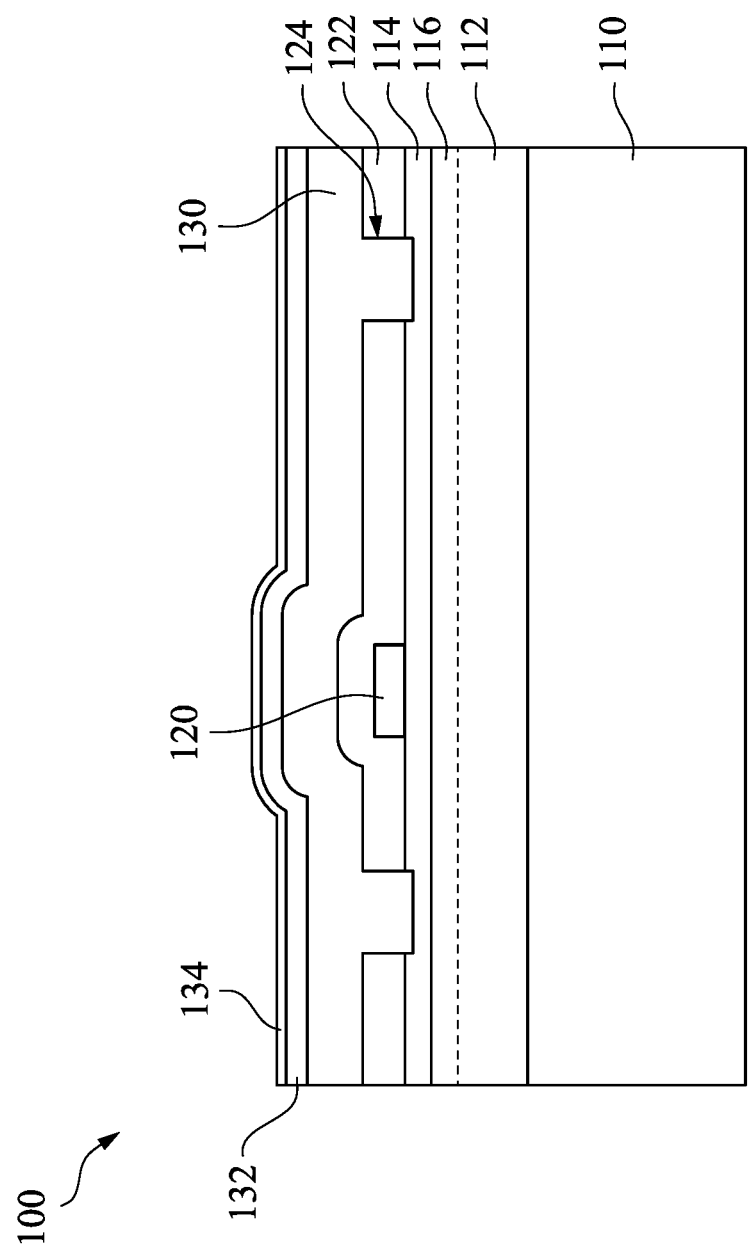

Referring to FIG. 4, an ohmic metal layer 130 is formed on the dielectric layer 122 and in the ohmic contact regions 124. The ohmic metal layer 130 is deposited on the dielectric layer 122 and in the ohmic contact regions 124. The deposition process can be sputter deposition, evaporation or chemical vapor deposition (CVD). Exemplary ohmic metals include, but are not limited to, Ta, TaN, Pd, W, $WSi_2$, Ti, Al, TiN, AlCu, AlSiCu and Cu. The thickness of the ohmic metal layer 130 is ranging from about 2000 to 5000 angstrom. Post deposition annealing of the ohmic metal layer 130 is then performed to induce any desirable reactions between the ohmic metal and the adjacent AlGaN layer 114. In some embodiments, the ohmic metal layer 130 is formed by rapid thermal annealing (RTA) at an annealing temperature ranging from approximately 800° C. to approximately 900° C.

An anti-reflective coating (ARC) layer 132 is further formed on the ohmic metal layer 130. The ARC layer 132 is made of, for example, TiN or other suitable material. The ARC layer 132 is formed by a deposition process. In some embodiments, the ARC layer 132 is deposited by sputter deposition, evaporation or CVD. The ARC layer 132 may have a thickness ranging from about 50 to 500 angstrom.

Also, an etch stop layer 134 is formed on the ARC layer 132. The etch stop layer 134 can be made of oxide, SiN, or other suitable material. The etch stop layer 134 is deposited using a suitable vapor deposition processes (e.g., CVD) or another method. Exemplary silicon nitrides (SiN) include amorphous SiN, trisilicon tetranitride, disilicon mononitride, and silicon mononitride. In some embodiments, the etch stop layer 134 is deposited to a thickness ranging from about 100 to 1000 angstrom.

Figure 5:
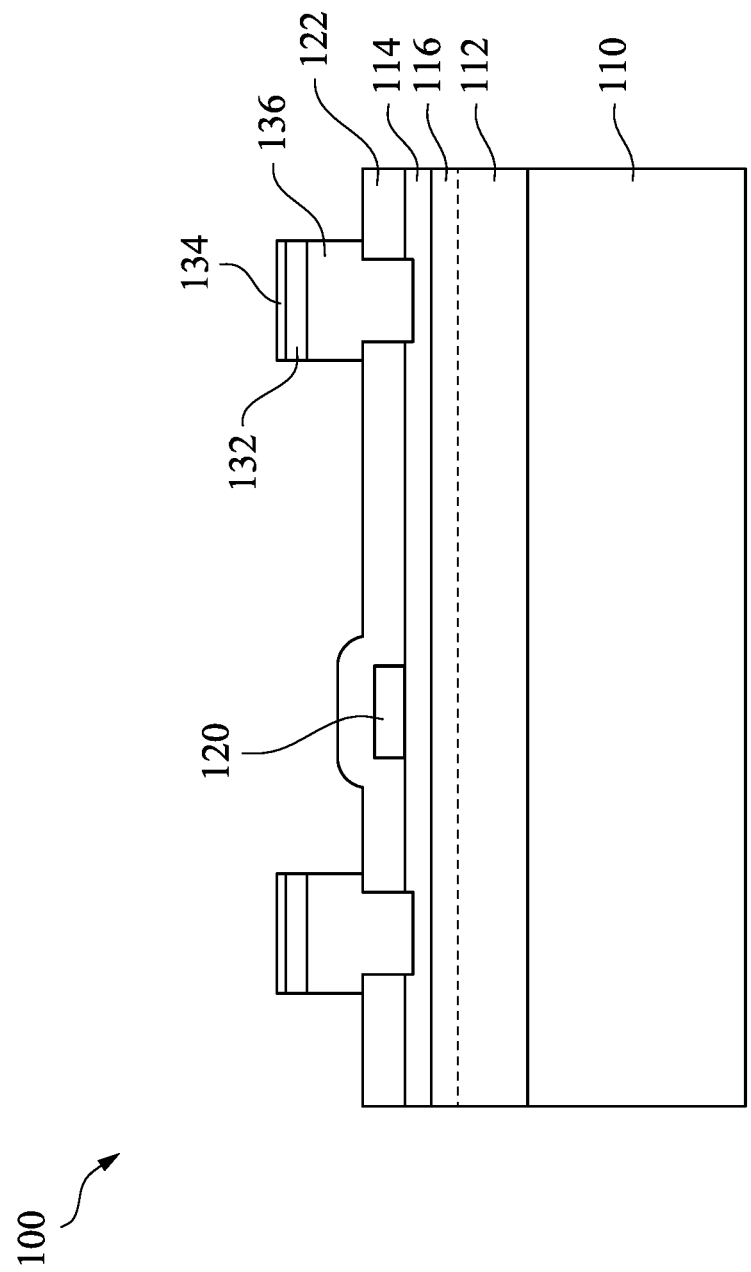

Referring to FIG. 5, the portions of the ohmic metal layer 130, the ARC layer 132, and the etch stop layer 134 are removed to define an ohmic contacts in the contact region 124. The ARC layer 132 and the etch stop layer 134 are formed on the ohmic contact 136. The removing process includes performing one or more etching processes. The ohmic contacts 136 are connected to the AlGaN layer 114. In some embodiments, the ohmic contacts 136 connect to the AlGaN layer 114 directly. The ohmic contacts 136 are utilized as a part of drain electrode and a source electrode.

Figure 6:
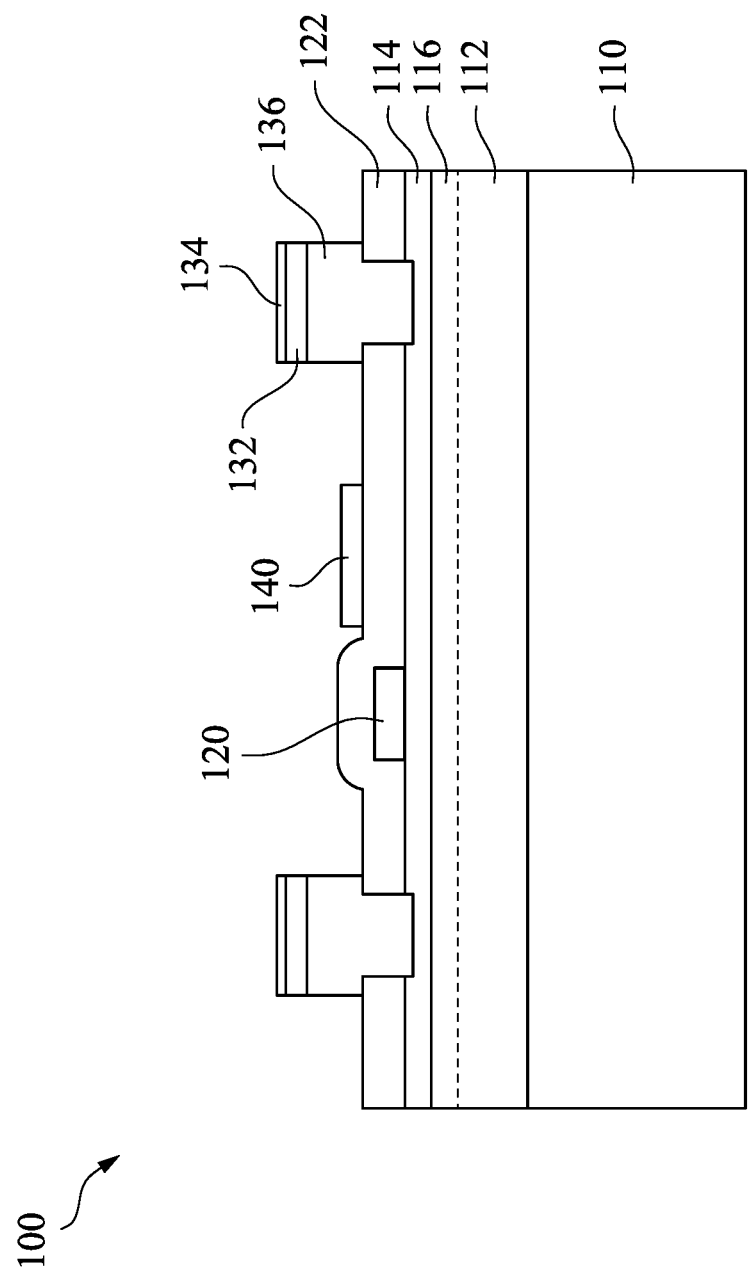

Referring to FIG. 6, a gate field plate 140 is formed on the dielectric layer 122. The processes of forming the gate field plate 140 include forming a gate field plate metal layer on the dielectric layer 122 and patterning the gate field plate metal layer. The gate field plate metal layer can be formed by a deposition process, such as an ALD process, a CVD process, or a PVD process. The patterning process includes performing one or more etching processes. The gate field plate 140 can be made of TiN, Ti, Al, AlCu, Cu, or other suitable metal. The thickness of the gate field plate 140 is in range from 100 to 1200 angstrom.

The gate field plate 140 is disposed adjacent to the doped GaN region 120. The gate field plate 140 is formed between the doped GaN region 120 and one of the ohmic contacts 136. The gate field plate 140 does not cover the doped GaN region 120. The gate field plate 140 is electrically to one of the ohmic contacts 136.

The etch stop layer 134 is utilized to protect the underlying ARC layer 132 and the ohmic contact 136 from being etched during the process of etching the gate field plate 140. The ARC layer 132 is protected by the etch stop layer 134, such that the surface of the ARC layer 132 may keep smooth. The ohmic contact 136 is also protected by the etch stop layer 134, such that the profile of the ohmic contact 136 is maintained, and the issue of metal loss of the ohmic contact 136 during the process of defining the gate field plate 140 can be prevented.

Figure 7:
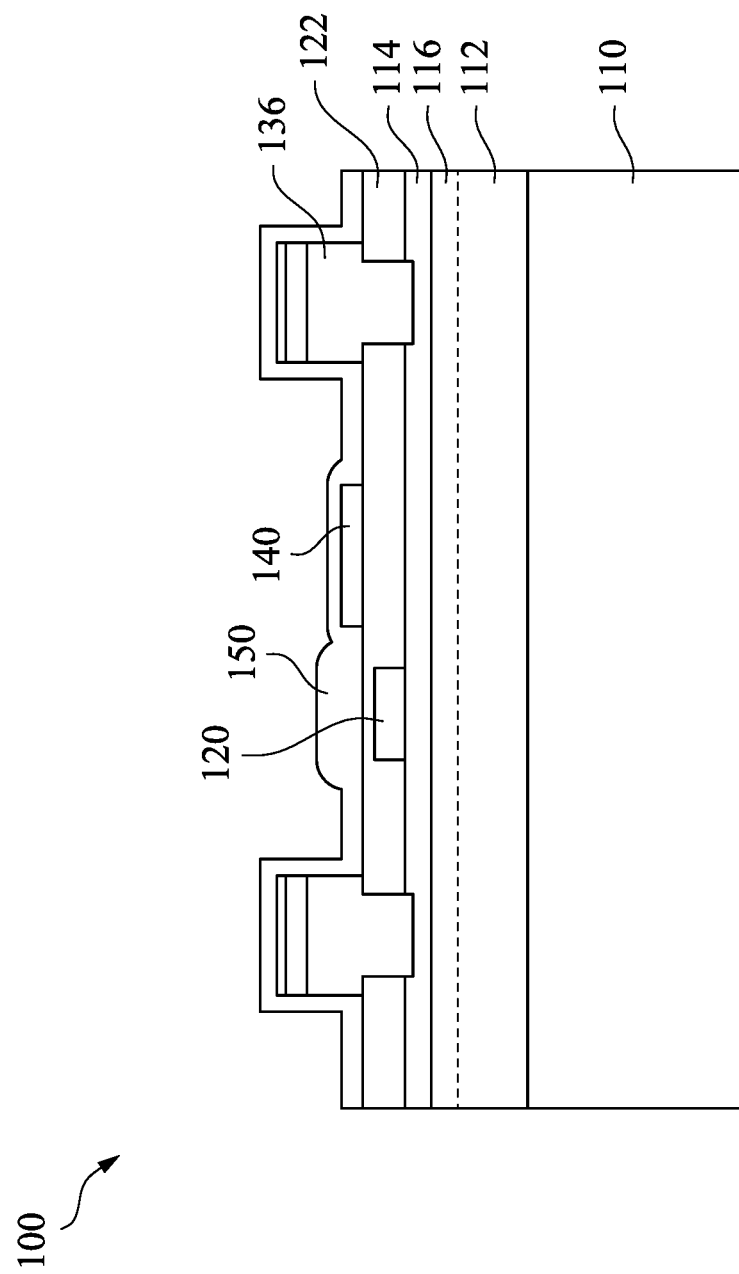

Referring to FIG. 7, another dielectric layer 150 is formed on the dielectric layer 122. The dielectric layer 150 also covers the gate field plate 140 and the ohmic contacts 136. The dielectric layer 150 can be made of silicon oxide, silicon nitride, silicon oxynitride, silicon carbide, low-dielectric constant dielectric material or a combination thereof. The dielectric layer 150 can be formed by a deposition process, such as an ALD process, a CVD process, or a PVD process. The thickness of the dielectric layer 150 is in a range from about 500 angstrom to about 5000 angstrom.

Figure 8:
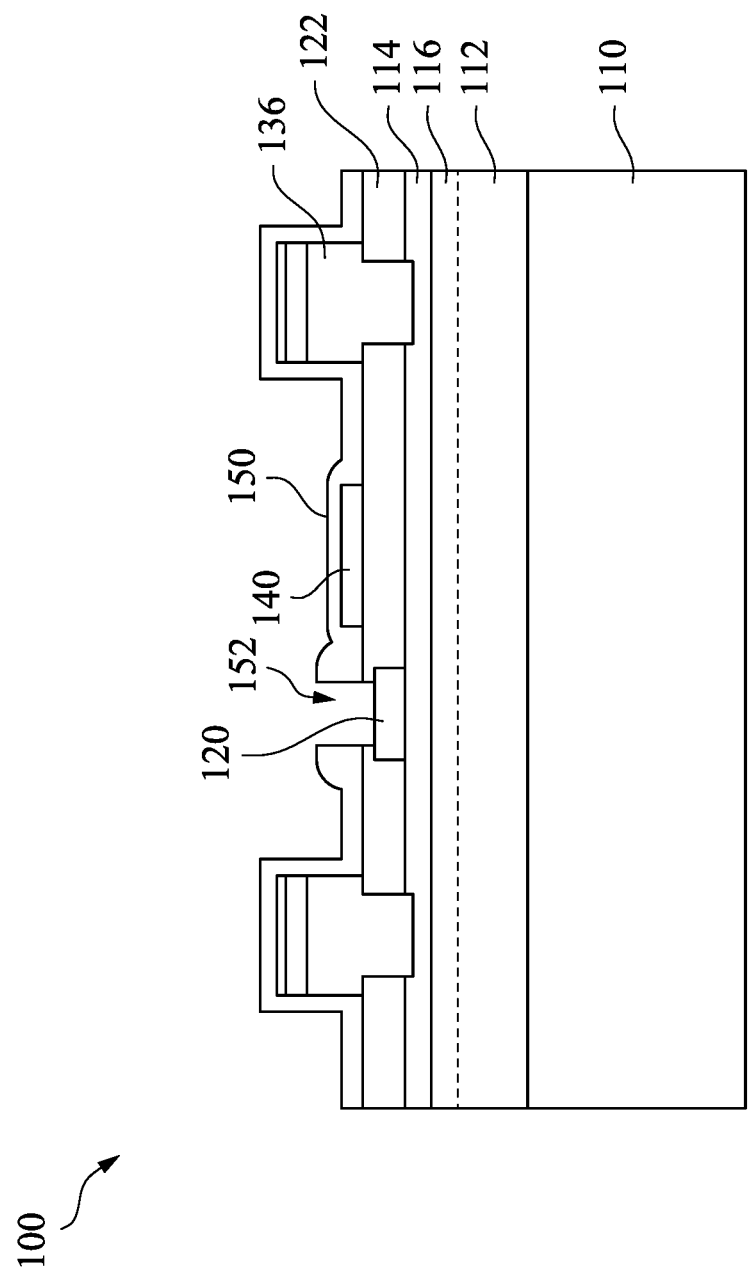

Referring to FIG. 8, an opening 152 is formed penetrating the dielectric layers 122 and 150 to expose at least a part of the doped GaN region 120. The processes of forming the opening 152 includes forming a mask layer, such as a photoresist layer formed in the dielectric layer 150, and the mask layer is patterned by a lithography process to form a plurality of features and at least one opening defined by the features on the dielectric layer 150. The pattern of the mask layer is formed according to a predetermined integrated circuit pattern, in which the position of the opening of the mask layer is substantially the same as the position of the opening 152. The lithography process may include photoresist coating, exposing, post-exposure baking, and developing. Then, an etching process is performed to form the opening 152 on the doped GaN region 120.

After the opening 152 is formed to expose the doped GaN region 120, a gate metal stack is formed in the opening 152 and is connected to the doped GaN region 120. The gate metal stack is formed on the doped GaN region 120 and is interposed between the source and drain contacts (e.g., the ohmic contacts 136). The gate metal stack includes a conductive material layer, such as a metal layer that functions as a gate electrode configured for voltage bias and electrical coupling with the channel. According to different embodiments, the gate metal stack may have different compositions. FIG. 9 to FIG. 12 shows the variations of the gate metal stack of the semiconductor device, in accordance with some embodiments of the disclosure.

Figure 9:
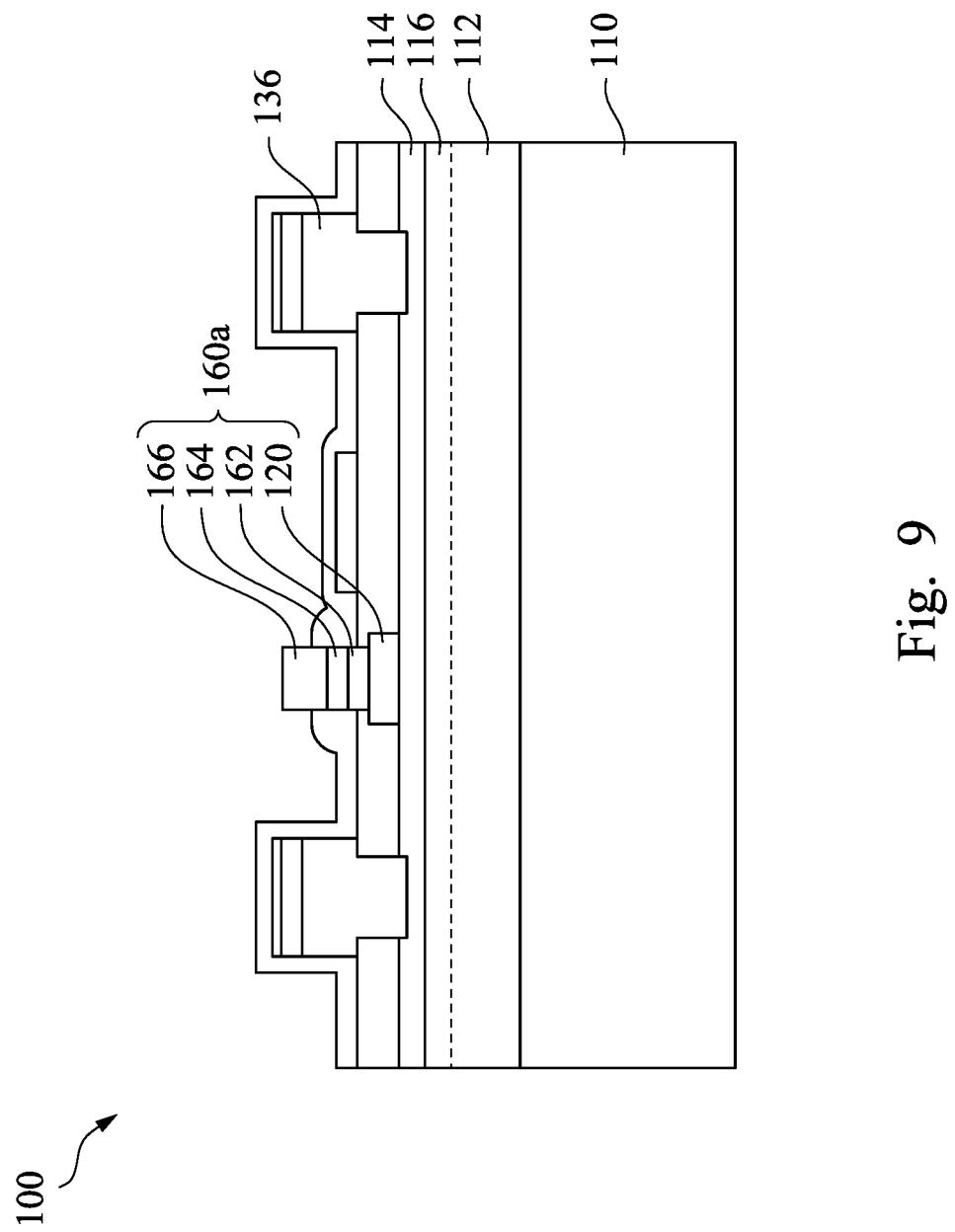

In FIG. 9, the gate metal stack 160a includes one or more junction isolation features disposed underlying the metal layer 166. The doped GaN region 120 is a p-type doped GaN region. The junction isolation feature includes one n-type doped semiconductor layer 164, and one aluminum nitride (AlN) layer 162 disposed between the n-type doped semiconductor layer 164 and the p-type doped GaN region 120, the layers configured as a diode. In some embodiments, the AlN layer 162 can be formed by MOCVD or another suitable technique. The gate metal stack 160a results in a device yielding an enhancement mode (E-mode) device. In some embodiments, the n-type doped semiconductor layer 164 is an N-type doped III-V compound layer. In some embodiments, the n-type doped III-V compound layer is an n-type doped GaN layer. The n-type doped GaN layer 164 is doped by an n-type dopant, such as, but not limited to, silicon, oxygen, or a combination thereof. In some embodiments, the n-type doped GaN layer 164 can be formed by MOCVD or another suitable technique. The p-type doped GaN region 120 is doped by a p-type dopant, such as, but not limited to, magnesium, calcium, zinc, beryllium, carbon, and combinations thereof. In some embodiments, the p-type doped GaN region 120 can be formed by MOCVD or another suitable technique. The metal layer 168 includes Ti, Mo, Pt, Cr, W, Ni, Al, AlCu, AlSiCu, Cu, or other suitable material. In the embodiment depicted in FIG. 9, the gate metal stack 160a, the source and drain contacts 136, and the 2DEG region 116 (as a channel) in the GaN layer 112 are configured as an E-mode transistor, where when a positive voltage applied to the gate stack for forward bias is great enough, the E-mode transistor is turned on. Such a configured transistor is also referred to as an E-mode high electron mobility transistor (HEMT).

Figure 10:
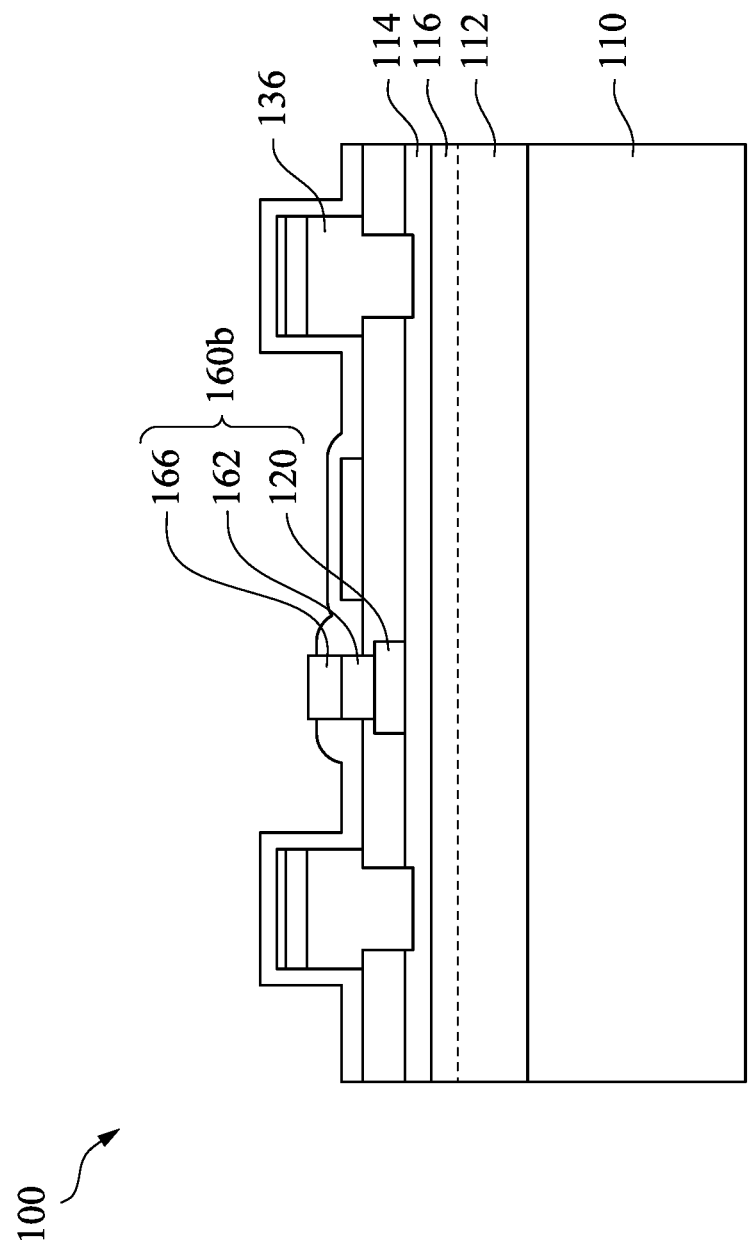

In FIG. 10, if the metal layer 166 of the gate metal stack 160b is placed in direct contact with the AlN layer 162 which is disposed over the p-type doped GaN region 120 adjacent the AlGaN layer 114, the resulting device yields a shottky barrier diode or a low threshold voltage E-mode device. In some embodiments, the MN layer 162 can be formed by MOCVD or another suitable technique. In some embodiments, the p-type doped GaN region 120 is doped by a p-type dopant, such as, but not limited to, magnesium, calcium, zinc, beryllium, carbon, and combinations thereof. In some embodiments, the p-type doped GaN region 120 can be formed by MOCVD or another suitable technique.

Figure 11:
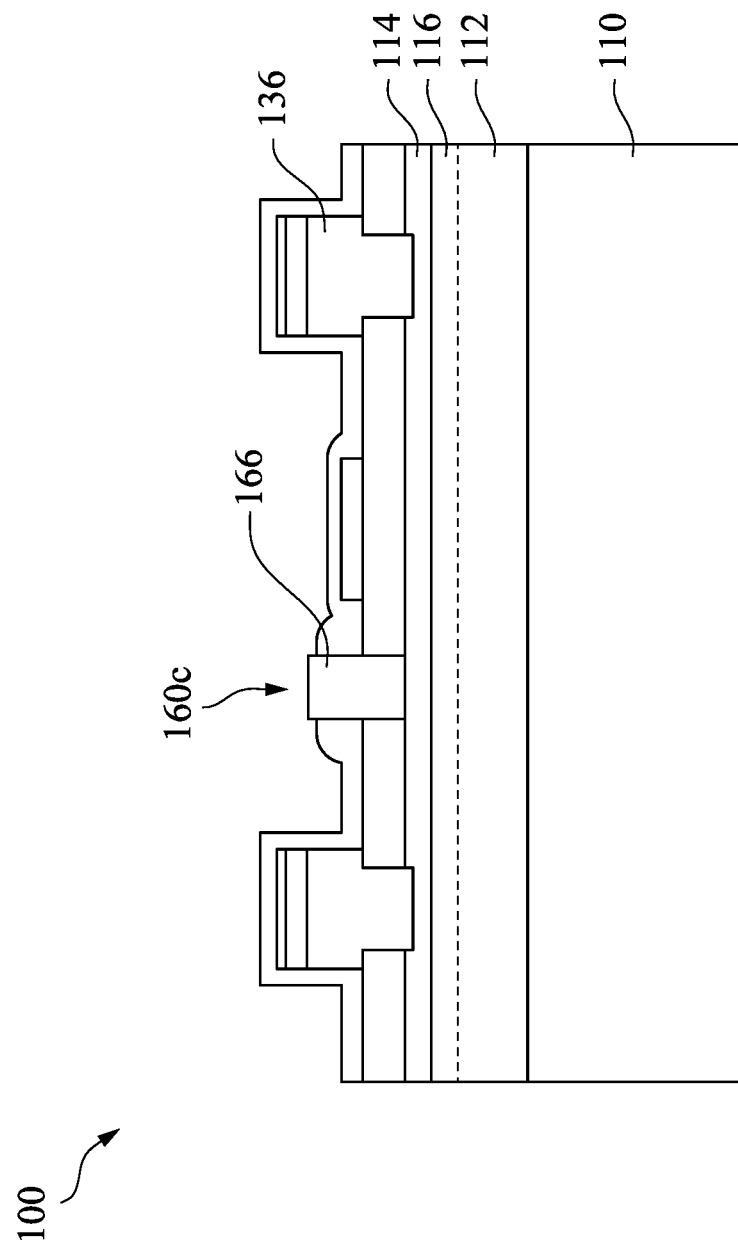

In FIG. 11, the p-type doped region 120 is omitted, and the metal layer 166 of the gate metal stack 160c is placed in direct contact with the AlGaN layer 114, the resulting device yields a depletion mode (D-mode) device. In some embodiments, the gate metal stack 160c, the source and drain contacts (e.g., the ohmic contacts 136), and the 2DEG region 116 in the GaN layer 112 are configured as a D-mode transistor, where the device is normally on at zero gate-source voltage. Thus, the D-mode transistor can be turned off by pulling the gate with a negative voltage. Such a configured transistor is also referred to as a D-mode high electron mobility transistor (HEMT).

Figure 12:
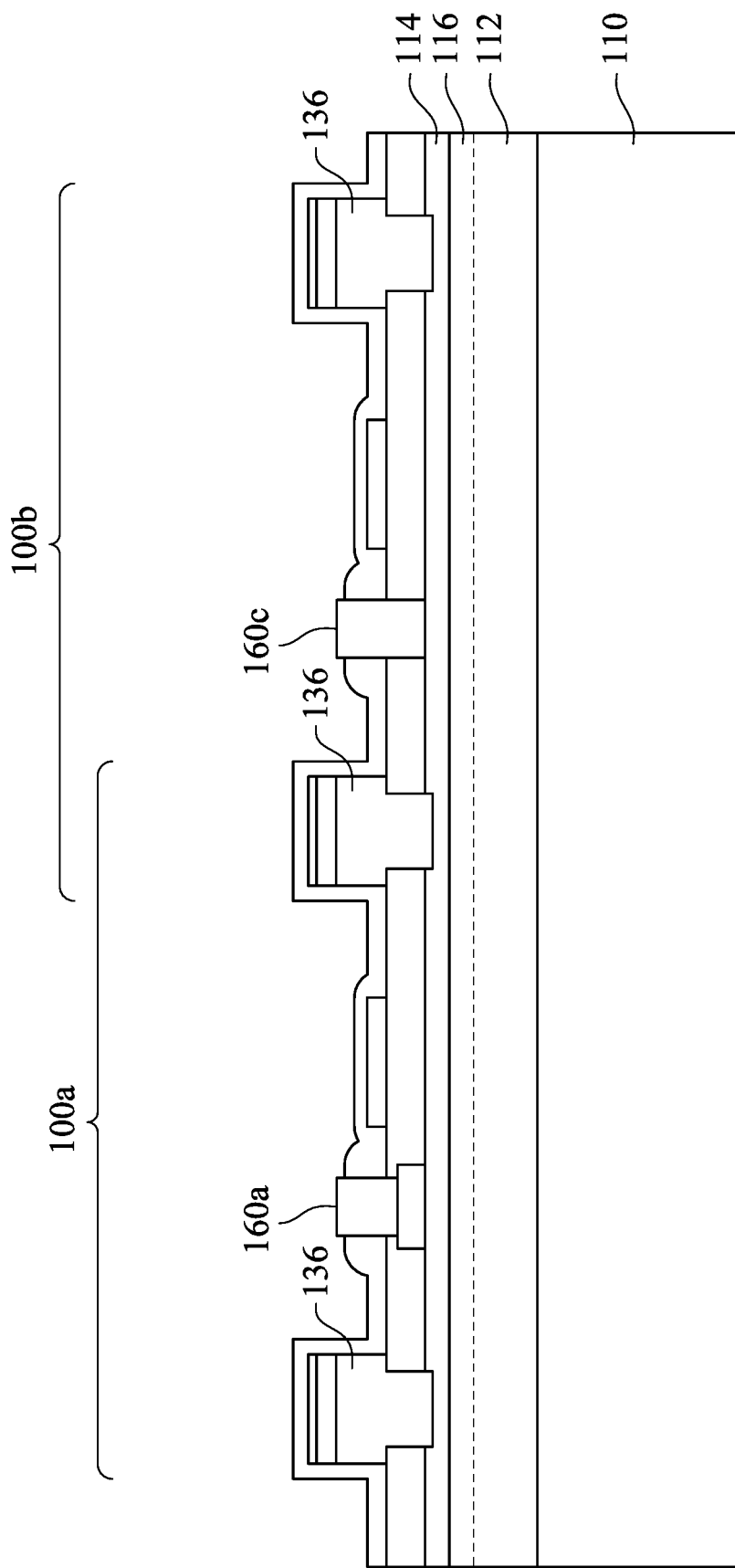

However, in some embodiments, the semiconductor device may have plural E-mode and/or D-mode HEMTs, as shown in FIG. 12. In FIG. 12, the E-mode HEMT 100a including the gate metal stack 160a, the source and drain contacts 136, and the 2DEG region 116 (as a channel) in the GaN layer 112 is formed on the substrate 110. The D-mode HEMT 100b including the gate metal stack 160c, the source and drain contacts (e.g., the ohmic contacts 136), and the 2DEG region 116 in the GaN layer 112 is formed on the substrate 110. The E-mode HEMT 100a and the D-mode HEMT 100b may share the ohmic contact 136.

Figure 13:
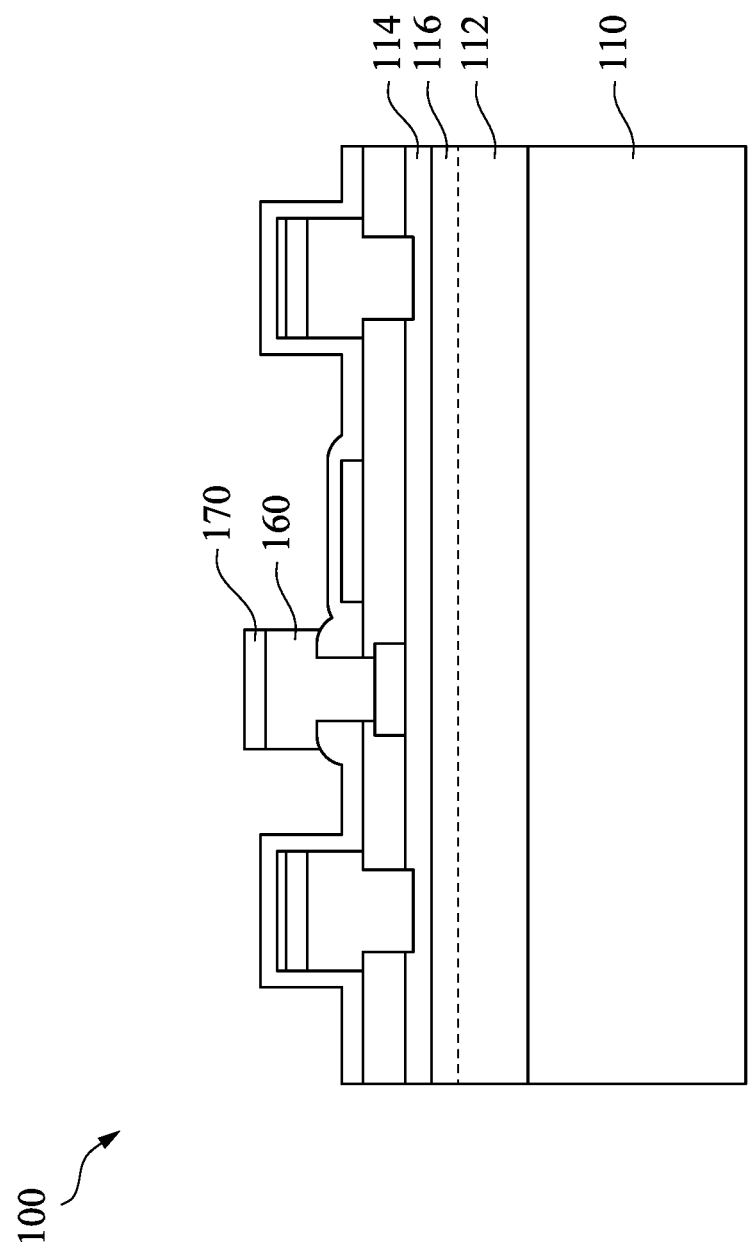

Referring to FIG. 13, after the gate metal stack 160, which can be any one or several of the gate metal stacks 160a-160c having the compositions and structures previously described, is formed on the semiconductor structure 100, another ARC layer 170 is formed on gate metal stack 160. The ARC layer 170 is made of, for example, TiN, SiON or other suitable material. The ARC layer 170 is formed by a deposition and etching process. In some embodiments, the ARC layer 170 is deposited by sputter deposition, evaporation or CVD. The ARC layer 170 may have a thickness ranging from about 50 to 1000 angstrom.

Figure 14:
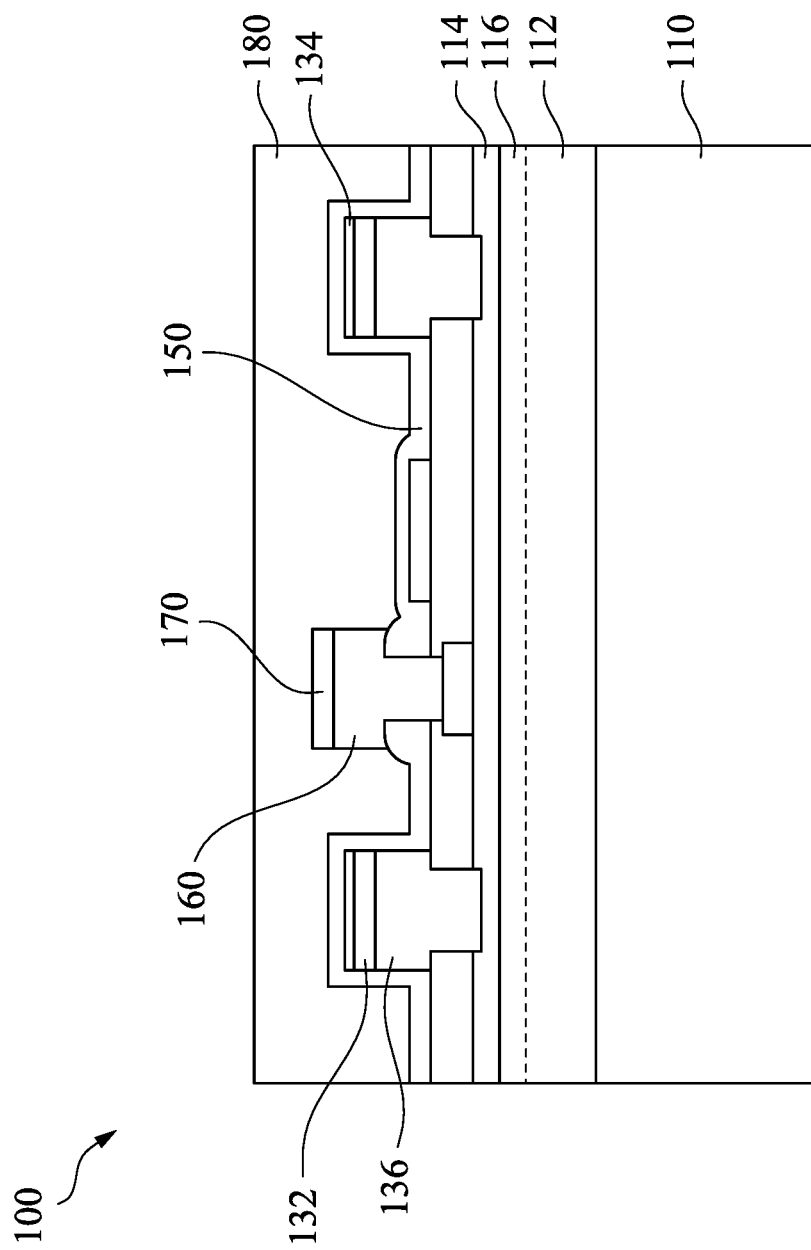

Referring to FIG. 14, an inter-layer dielectric (ILD) layer 180 is deposited on the substrate 110. The ILD layer 180 covers the dielectric layer 150 and the gate metal stack 160, and the ARC layer 170. The ILD layer 180 is utilized to isolate and support capacitor features such as parallel conductive metal lines. The ILD layer 180 is made of dielectric material. In some embodiments, the ILD layer 180 is made of low dielectric constant (k) materials (i.e. 'low k' materials), such as oxide, fluorinated silica glass (FSG), SiLK™, SiN, or other suitable dielectric material. In some embodiments, an annealing process may be carried out to improve the electrical insulation characteristics of the ILD layer 180. Additionally, the ILD layer 180 may be doped, such as carbon doped oxide or boron/phosphorus doped oxide, to improve its step coverage and annealing characteristics. The surface of the ILD layer 180 is flattened. The process of flattening the ILD layer 180 includes performing a CMP process.

Figure 15:
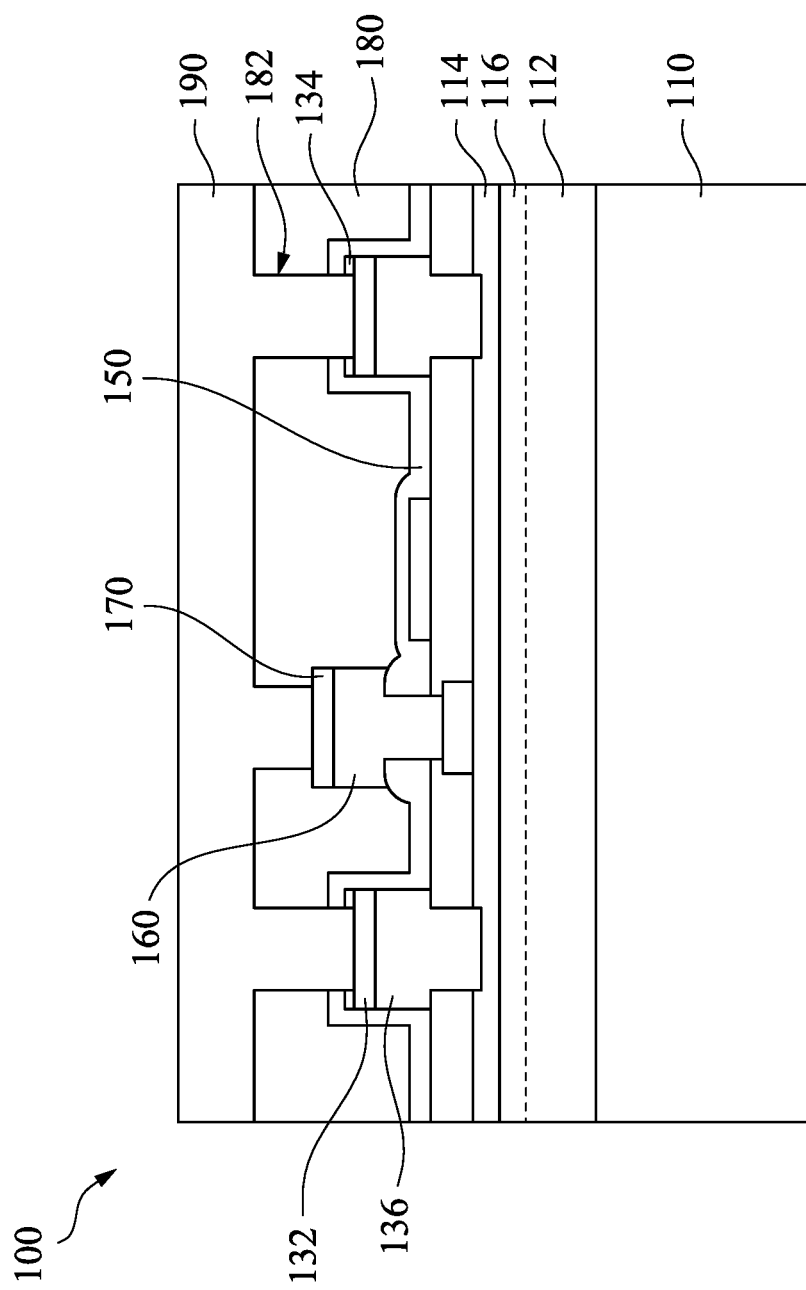

Referring to FIG. 15, a plurality of vias 182 are formed in the ILD layer 180. The vias 182 are led to the ARC layers 132, 170. The vias 182 can be formed by one or more etching processes. Portions of the etch stop layer 134 are also removed to expose the ARC layer 132. The etchant utilized in the etching process may have high selectivity between the ARC layer 132 and other layers, such as the etch stop layer 134, the dielectric layer 150, and the ILD layer 180.

After the vias are 182 formed in the ILD layer 180 to expose the ARC layers 132 and 170, a metal layer 190 is formed on the ILD layer 180 and fills the vias 182. The metal layer 190 can be formed by one or more deposition processes. The deposition process can be sputter deposition, evaporation or chemical vapor deposition (CVD). The metal layer 190 is made of Ti, Mo, Pt, Cr, W, Ni, Al, AlCu, AlSiCu, Cu, or other suitable material.

Figure 16:
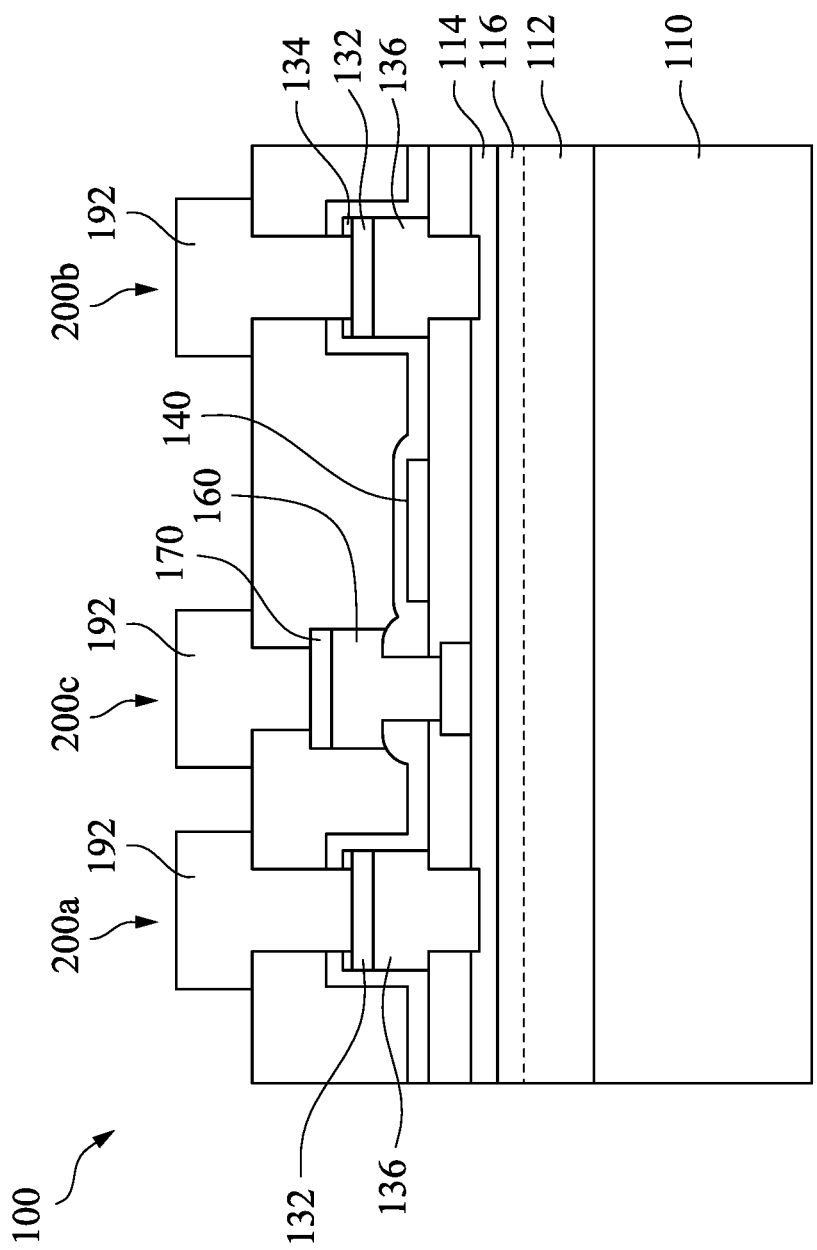

Referring to FIG. 16, the metal layer is patterned and becomes a plurality of metal contacts 192 electrically connected to the ohmic contacts 136 respectively. The metal contacts 192 penetrate the etch stop layer 134 to connect to the ARC layer 132. In some embodiments, one or more of the ohmic contacts 136, the ARC layer 132, and one or more metal contacts 192 form a source electrode 200a; one or more of the ohmic contacts 136, the ARC layer 132, and one or more metal contacts 192 form a drain electrode 200b; one or more of the gate metal stacks 160, the ARC layer 170, and one or more metal contacts 192 form a gate electrode 200c.

In some embodiments, the gate field plate 140 is arranged between the gate electrode 200c and the drain electrode 200b. The gate field plate 140 is electrically connected to the source electrode 200a. The introduction of gate field plate 140 modulates the current collapse effect, and the electric field between the gate electrode 200c and the drain electrode 200b has been re-distribution. In the situation of without making a gate field plate, the electric field strength has a peak region between the gate electrode 200c and the drain electrode 200b. However, when the gate field plate 140 is formed between gate electrode 200c and the drain electrode 200b, the electric field intensity maximum region is expensed toward the drain electrode 200b, the peak of electric field between the gate electrode 200c and the drain electrode 200b is reduced, which can greatly improve the breakdown voltage of the device. Furthermore, the gate field plate 140 also reduce gate to drain capacitance (Cgd).

Figure 17:
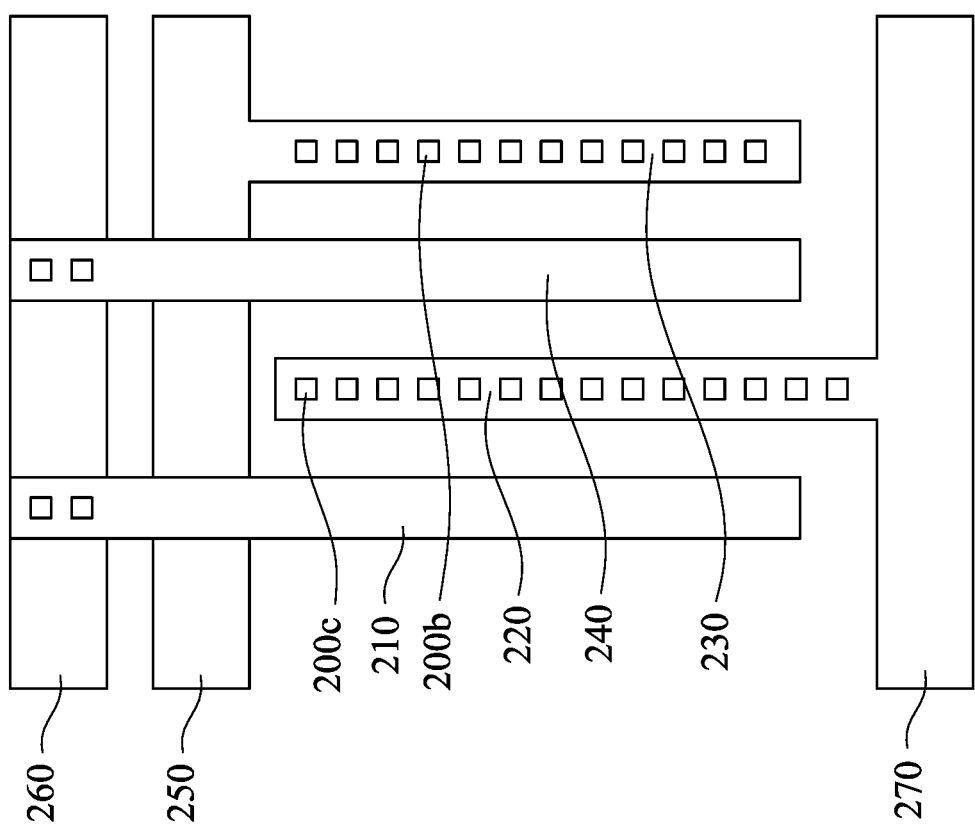
FIG. 17 and FIG. 18 are schematic top view of the semiconductor device, according to some embodiments of the disclosure.

Referring to FIG. 17, which is a schematic top view of the semiconductor device, according to some embodiments of the disclosure. The semiconductor device may include a plurality of E-mode HEMTs or D-mode HEMTs. The semiconductor device includes a source line 210, a gate line 220, a drain line 230, and a gate field plate 240 in a parallel arrangement. The gate line 220 includes a plurality of the gate electrodes 200c arranged linearly. The drain line 230 includes a plurality of drain electrodes 200b arranged linearly. In some embodiments, the gate line 220 is arranged between the source line 210 and the drain line 230, and the gate field plate 240 is arranged between the gate line 220 and the drain line 230. The semiconductor device further includes a first metal line 250 connected to the drain line 230 and is perpendicular to the drain line 230. The semiconductor device further includes a second metal line 260 arranged perpendicular to the source line 210, the gate line 220, the drain line 230, and the gate field plate 240. The source line 210 and the gate field plate 240 are connected to the second metal line 260 through vias, such that the gate field plate 240 is electrically connected to the source line 210 through the second metal line 260. The semiconductor device further includes a third metal line 270 connected to the gate line 220 and is perpendicular to the gate line 220.

Figure 18:
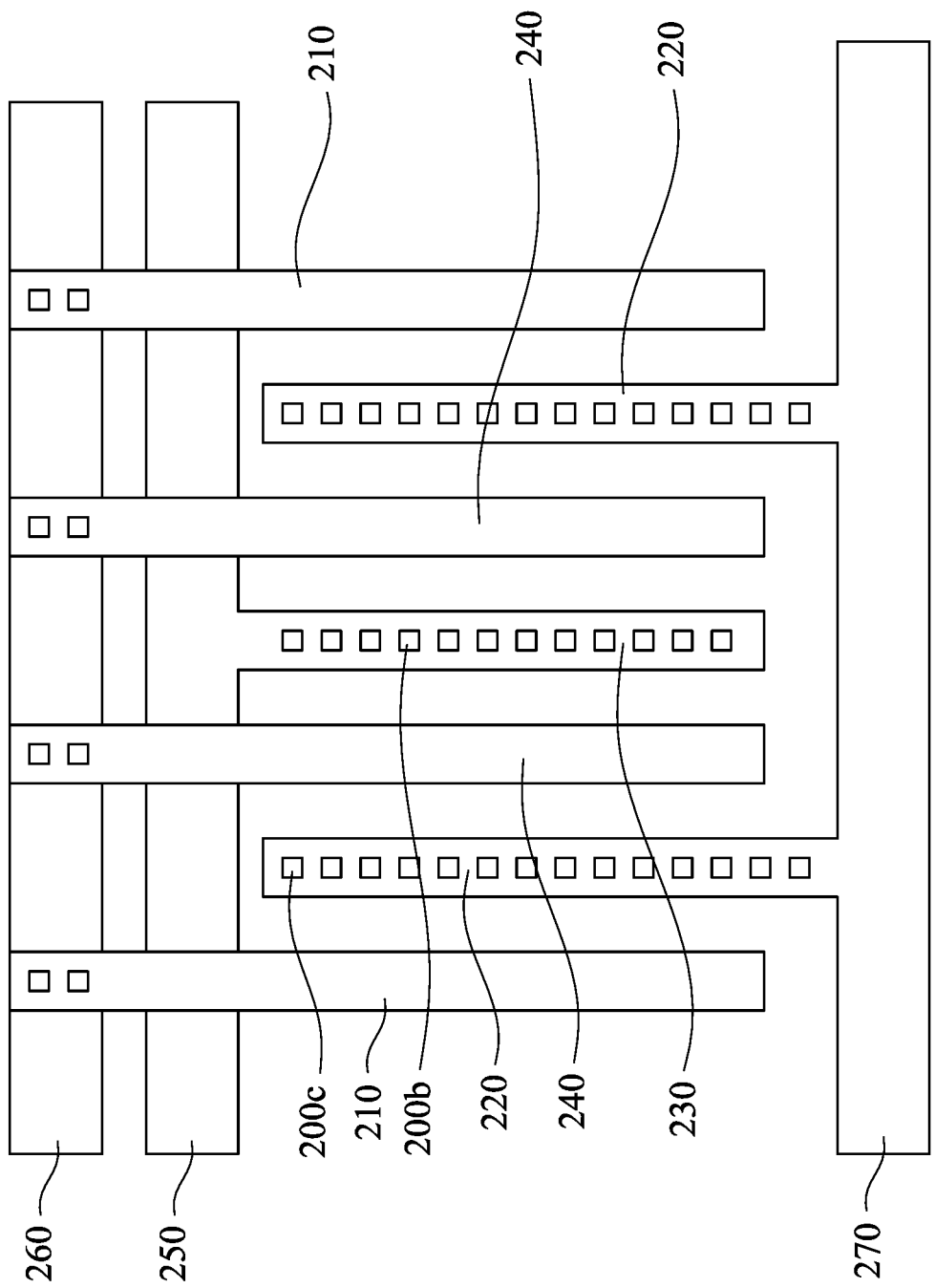

Referring to FIG. 18, which is a schematic top view of the semiconductor device, according to some embodiments of the disclosure. The semiconductor device may include both E-mode HEMTs and D-mode HEMTs. The semiconductor device includes a plurality of source lines 210, a plurality of gate lines 220, at least one drain line 230, and a plurality of gate field plates 240 in a parallel arrangement. Each of the gate lines 220 includes a plurality of the gate electrodes 200c arranged linearly. The drain line 230 includes a plurality of drain electrodes 200b arranged linearly. In some embodiments, E-mode HEMTs and the D-mode HEMTs may share the drain line 230. The gate line 220 is arranged between the source line 210 and the drain line 230, and the gate field plate 240 is arranged between the gate line 220 and the drain line 230. Namely, the gate field plates 240 are arranged at opposite sides of the drain line 230, the gate lines 220 are arranged at opposite sides of the gate field plates 240, and the source lines 210 are arranged at opposite sides of the gate lines 240. The semiconductor device further includes a first metal 250 connected to the drain line 230 and is perpendicular to the drain line 230. The semiconductor device further includes a second metal line 260 arranged perpendicular to the source lines 210, the gate lines 220, the drain line 230, and the gate field plates 240. The source lines 210 and the gate field plates 240 are connected to the second metal line 260 through vias, such that the gate field plates 240 are electrically connected to the source lines 210 through the second metal line 260. The semiconductor device further includes a third metal line 270 connected to the gate lines 220 and is perpendicularly to the gate lines 220.

The semiconductor device includes an etch stop layer formed on the ARC layer, such that the ARC layer is protected by the etch stop layer during the process of forming the gate field plate. The profile of the ohmic contact is maintained, and the issue of metal loss of the ohmic contact during the process of defining the gate field plate can be prevented.

According to some embodiments of the disclosure, a semiconductor device includes a first III-V compound layer, a second III-V compound layer over the first III-V compound layer, a source contact and a drain contact over the second III-V compound layer, a gate contact over the second III-V compound layer and between the source contact and the drain contact, a gate field plate over the second III-V compound layer, a first etch stop layer over the source contact, and a second etch stop layer over the drain contact and separated from the first etch stop layer.

According to some embodiments of the disclosure, a semiconductor device includes a first III-V compound layer, a second III-V compound layer over the first III-V compound layer, a source/drain contact over the second III-V compound layer, a gate contact over the second III-V compound layer, a gate field plate over the second III-V compound layer, a first anti-reflective coating (ARC) layer over the source/drain contact, a second ARC layer over the gate contact and separated from the first ARC layer, and an etch stop layer over the first ARC layer.

According to some embodiments of the disclosure, a semiconductor device includes a first III-V compound layer, a second III-V compound layer over the first III-V compound layer, a source/drain contact over the second III-V compound layer, a gate contact over the second III-V compound layer, a gate field plate over the second III-V compound layer, an anti-reflective coating (ARC) layer over the source/drain contact, and an etch stop layer over the ARC layer and separated from the gate field plate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a III-V compound layer;
   a source contact and a drain contact over the III-V compound layer;
   a gate contact over the III-V compound layer and between the source contact and the drain contact;
   a gate field plate over the III-V compound layer;
   a first etch stop layer over the source contact;
   a second etch stop layer over the drain contact and separated from the first etch stop layer;
   a first anti-reflective coating (ARC) layer over the gate contact;
   a second ARC layer between the first etch stop layer and the source contact;
   a dielectric layer surrounding the gate contact and in contact with the first ARC layer; and
   a protection oxide layer between the dielectric layer and the source contact, wherein a top surface of the second ARC layer is separated from the dielectric layer by the protection oxide layer.

2. The semiconductor device of claim 1, wherein a top surface of the gate field plate is lower than a top surface of the gate contact.

3. The semiconductor device of claim 1, further comprising:
   a third ARC layer between the second etch stop layer and the drain contact, wherein the second ARC layer is separated from the third ARC layer.

4. The semiconductor device of claim 1, wherein the second ARC layer and the gate field plate comprises the same material.

5. The semiconductor device of claim 1,
   wherein the protection oxide layer surrounds the source contact, the drain contact, and a bottom portion of the gate contact, and the dielectric layer surrounds a top portion of the gate contact.

6. A semiconductor device comprising:
   a first semiconductor layer;
   a second semiconductor layer over the first semiconductor layer;
   a source/drain contact over the second semiconductor layer;
   a gate contact over the second semiconductor layer;
   a gate field plate over the second semiconductor layer;
   a first anti-reflective coating (ARC) layer over the source/drain contact;
   a second ARC layer over the gate contact and separated from the first ARC layer;
   an etch stop layer over the first ARC layer;
   a first dielectric layer surrounding the gate contact and in contact with the second ARC layer; and
   a protection oxide layer between the first dielectric layer and the source/drain contact, wherein a top surface of the first ARC layer is separated from the first dielectric layer by the protection oxide layer.

7. The semiconductor device of claim 6, wherein the gate field plate is free from coverage by the etch stop layer.

8. The semiconductor device of claim 6, wherein the second ARC layer is free from coverage by the etch stop layer.

9. The semiconductor device of claim 6, wherein a sidewall of the etch stop layer is substantially aligned with a sidewall of the first ARC layer.

10. The semiconductor device of claim 6, wherein a sidewall of the first ARC layer is substantially aligned with a sidewall of the source/drain contact.

11. The semiconductor device of claim 6, wherein a sidewall of the second ARC layer is substantially aligned with a sidewall of the gate contact.

12. The semiconductor device of claim 6, further comprising a conductive contact separated from the source/drain contact by the first ARC layer.

13. The semiconductor device of claim 6, further comprising:
    a second dielectric layer over the second semiconductor layer, wherein a top surface of the second dielectric layer is lower than a top surface of the source/drain contact, and the gate field plate is in contact with the top surface of the second dielectric layer.

14. The semiconductor device of claim 6,
    wherein the etch stop layer comprises an oxide.

15. A semiconductor device comprising:
    a first III-V compound layer;
    a second III-V compound layer over the first III-V compound layer;
    a source/drain contact over the second III-V compound layer;
    a gate contact over the second III-V compound layer;
    a gate field plate over the second III-V compound layer;
    a first anti-reflective coating (ARC) layer over the source/drain contact;
    an etch stop layer over the first ARC layer and separated from the gate field plate;
    a second ARC layer over the gate contact;
    a dielectric layer surrounding the gate contact and in contact with the second ARC layer; and
    a protection oxide layer between the dielectric layer and the source/drain contact, wherein a top surface of the first ARC layer is separated from the dielectric layer by the protection oxide layer.

16. The semiconductor device of claim 15, wherein the gate contact is free from coverage by the etch stop layer.

17. The semiconductor device of claim 15, further comprising:
    a conductive contact in contact with the second ARC layer, wherein the conductive contact is separated from the gate contact by the second ARC layer.

18. The semiconductor device of claim 1, wherein the first ARC layer is a TiN layer.

19. The semiconductor device of claim 1, wherein the second ARC layer is a TiN layer.

20. The semiconductor device of claim 1, wherein the gate field plate is a TiN layer.

* * * * *